United States Patent
Hsieh et al.

(10) Patent No.: US 9,496,235 B2
(45) Date of Patent: Nov. 15, 2016

(54) PILLAR DESIGN FOR CONDUCTIVE BUMP

(71) Applicant: Taiwan Semiconductor Manufacturing Company, Ltd., Hsin-Chu (TW)

(72) Inventors: Cheng-Chieh Hsieh, Tainan County (TW); Cheng-Lin Huang, Hsin-Chu (TW); Po-Hao Tsai, Zhongli (TW); Shang-Yun Hou, Jubei (TW); Jing-Cheng Lin, Hsin-Chu (TW); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 16 days.

(21) Appl. No.: 14/466,877

(22) Filed: Aug. 22, 2014

(65) Prior Publication Data

US 2014/0361432 A1 Dec. 11, 2014

Related U.S. Application Data

(62) Division of application No. 13/189,127, filed on Jul. 22, 2011.

(51) Int. Cl.
*H01L 23/00* (2006.01)
*H01L 25/00* (2006.01)

(52) U.S. Cl.
CPC ............ *H01L 24/14* (2013.01); *H01L 24/11* (2013.01); *H01L 24/13* (2013.01); *H01L 24/16* (2013.01); *H01L 24/81* (2013.01); *H01L 25/50* (2013.01); *H01L 2224/1132* (2013.01); *H01L 2224/1145* (2013.01); *H01L 2224/1148* (2013.01); *H01L 2224/1191* (2013.01); *H01L 2224/11462* (2013.01); *H01L 2224/11464* (2013.01); *H01L 2224/11474* (2013.01); *H01L 2224/11616* (2013.01); *H01L 2224/11825* (2013.01); *H01L 2224/11849* (2013.01); *H01L 2224/13013* (2013.01); *H01L 2224/13015* (2013.01); *H01L 2224/13018* (2013.01); *H01L 2224/13022* (2013.01); *H01L 2224/13023* (2013.01); *H01L 2224/1362* (2013.01); *H01L 2224/13111* (2013.01); *H01L 2224/13144* (2013.01); *H01L 2224/13147* (2013.01);

(Continued)

(58) Field of Classification Search
CPC ....... H01L 24/11; H01L 24/13; H01L 24/16; H01L 24/81; H01L 24/14
USPC .......................................... 257/737; 438/614
See application file for complete search history.

(56) References Cited

U.S. PATENT DOCUMENTS 5,772,451 A * 6/1998 Dozier, II ............ B23K 20/004
257/E21.503
5,875,100 A 2/1999 Yamashita (Continued)

FOREIGN PATENT DOCUMENTS

CN 1359147 7/2002
CN 101728347 6/2010

*Primary Examiner* — Walter H Swanson
(74) *Attorney, Agent, or Firm* — Slater Matsil, LLP

(57) ABSTRACT

A system and method for conductive pillars is provided. An embodiment comprises a conductive pillar having trenches located around its outer edge. The trenches are used to channel conductive material such as solder when a conductive bump is formed onto the conductive pillar. The conductive pillar may then be electrically connected to another contact through the conductive material.

19 Claims, 4 Drawing Sheets

(52) U.S. Cl.
CPC .............. *H01L 2224/13155* (2013.01); *H01L 2224/13655* (2013.01); *H01L 2224/13671* (2013.01); *H01L 2224/16056* (2013.01); *H01L 2224/16148* (2013.01); *H01L 2224/16225* (2013.01); *H01L 2224/16227* (2013.01); *H01L 2224/81121* (2013.01); *H01L 2224/81143* (2013.01); *H01L 2224/81193* (2013.01); *H01L 2224/81815* (2013.01); *H01L 2225/06513* (2013.01); *H01L 2225/06565* (2013.01); *H01L 2924/0105* (2013.01); *H01L 2924/01023* (2013.01); *H01L 2924/01024* (2013.01); *H01L 2924/01028* (2013.01); *H01L 2924/01079* (2013.01); *H01L 2924/12* (2013.01); *H01L 2924/14* (2013.01); *H01L 2924/3512* (2013.01); *H01L 2924/35121* (2013.01); *H01L 2924/384* (2013.01); *H01L 2924/3841* (2013.01)

(56) References Cited

U.S. PATENT DOCUMENTS

| | | |
|---|---|---|
| 6,853,076 B2 | 2/2005 | Datta et al. |
| 6,930,032 B2 | 8/2005 | Sarihan et al. |
| 6,940,167 B2 | 9/2005 | Amador et al. |
| 7,026,188 B2 | 4/2006 | Taguchi et al. |
| 7,129,586 B2 | 10/2006 | Kashiwazaki |
| 7,579,692 B2 | 8/2009 | Matsushima et al. |
| 7,619,305 B2 | 11/2009 | Fan et al. |
| 7,674,651 B2 | 3/2010 | Oyama et al. |
| 2002/0011677 A1 | 1/2002 | Yokoi et al. |
| 2002/0033531 A1* | 3/2002 | Matsushima et al. ......... 257/734 |
| 2004/0212102 A1* | 10/2004 | Akram et al. ................. 257/781 |
| 2005/0277283 A1 | 12/2005 | Lin et al. |
| 2006/0055032 A1* | 3/2006 | Chang et al. ................. 257/734 |
| 2007/0145101 A1 | 6/2007 | Kataoka et al. |
| 2009/0250821 A1 | 10/2009 | Borthakur |
| 2010/0230811 A1 | 9/2010 | Shin et al. |
| 2011/0049705 A1 | 3/2011 | Liu et al. |
| 2012/0007228 A1 | 1/2012 | Lu et al. |

* cited by examiner

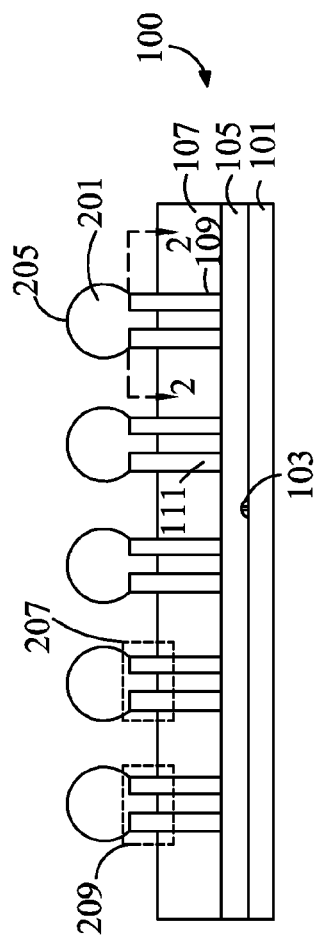
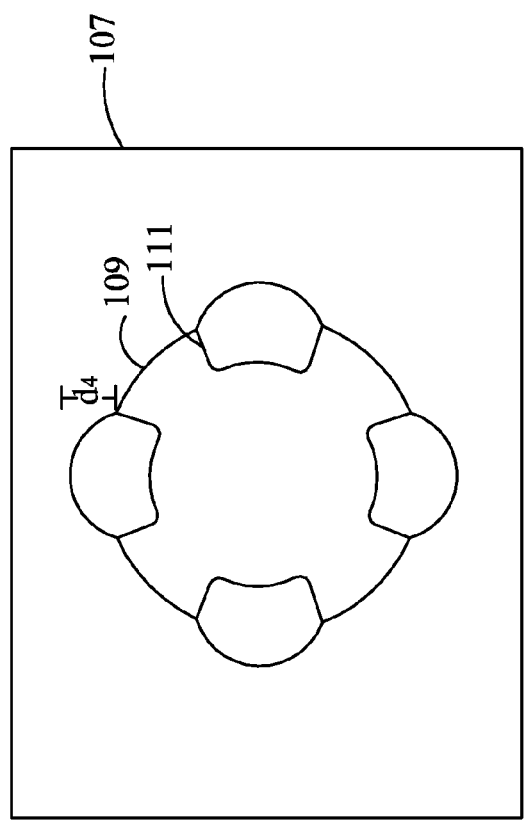
Figure 2A
Figure 2B

PILLAR DESIGN FOR CONDUCTIVE BUMP

This application is a divisional of U.S. patent application Ser. No. 13/189,127, filed Jul. 22, 2011, and entitled "Pillar Design for Conductive Bump," which application is hereby incorporated herein by reference

BACKGROUND

Conductive pillars may be formed on a semiconductor substrate in order to provide a physical and electrical connection point for external connectors. Generally, these conductive pillars are formed through a top passivation layer of the semiconductor substrate, thereby providing an external connection to the active devices formed on the semiconductor substrate. The conductive pillars are formed in a cylindrical shape in order to accommodate later formed connections, such as a spherical conductive bump.

The conductive bump may be formed on the conductive pillars from a connecting material such as solder. Typically, the conductive bump is placed onto the conductive pillars and then heated such that the conductive bump is partially liquefied and reflows into a bump shape. Once formed, the conductive bump may then be placed into contact with a separate substrate such as, for example, a printed circuit board or another semiconductor substrate. After the conductive bump has been placed in contact, the conductive bump may again be reflowed in order to bond the conductive bump to the separate substrate, thereby not only providing an electrical connection between the semiconductor substrate and the separate substrate, but also providing a bonding mechanism between the semiconductor substrate and the separate substrate.

However, for such a process to be reliable, the amount of conductive material must be precisely controlled when it is placed onto the circular conductive pillars. If there is an excessive amount of conductive material, there is an increased risk that conductive bumps that are adjacent to each other could unintentionally make contact and bridge during the reflow process, providing an undesired short-circuit. Conversely, if there is an insufficient amount of conductive material, there is an increased risk that there is not enough conductive material to provide a sufficient connection between substrates, thereby leading to an increased risk of a cold joint.

Additionally, the interface between the conductive bump and the circular conductive pillar is a vulnerable spot for cracks that may be initiated by the bonding process. This vulnerability could be further aggravated if the sidewalls of the conductive pillar is fully exposed to an ambient atmosphere and allowed to excessively oxidize, thereby increasing the risk of delamination between the conductive pillar and the underfill.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 2A-2B illustrate the placement of conductive material onto the conductive pillar and within the trenches in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the embodiments.

Embodiments will be described with respect to embodiments in a specific context, namely a conductive pillar with a conductive bump formed thereon. The embodiments may also be applied, however, to other physical and electrical connections.

Figure 1A:
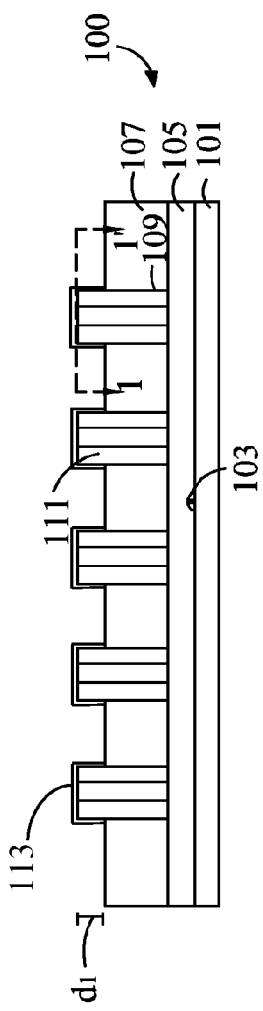
FIGS. 1A-1B illustrate a substrate with a conductive pillar that has trenches in accordance with an embodiment.

With reference now to FIG. 1A, there is shown a semiconductor die 100 onto which conductive bumps 205 (not shown in FIG. 1A but illustrated and discussed in FIG. 2A below) are desired to be formed. The semiconductor die 100 has a first substrate 101, active devices 103, metallization layers 105, a passivation layer 107, a series of conductive pillars 109, and trenches 111 along the sides of the conductive pillars 109. The first substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design. The active devices 103 may be formed using any suitable methods either within or else on the surface of the first substrate 101.

The metallization layers 105 are formed over the first substrate 101 and the active devices 103 and are designed to connect the various active devices 103 to form functional circuitry. While illustrated in FIG. 1 as a single layer, the metallization layers 105 are formed of alternating layers of dielectric and conductive material and may be formed through any suitable process (such as deposition, damascene, dual damascene, etc.). In an embodiment, there are at least four layers of metallization separated from the first substrate 101 by at least one interlayer dielectric layer (ILD), but the precise number of metallization layers 105 is dependent upon the design of the semiconductor die 100.

The passivation layer 107 may be formed on the metallization layers 105 over the active devices 103 in order to provide protection from physical and environmental harm that exposure may cause. The passivation layer 107 may be made of one or more suitable dielectric materials such as polymers, silicon oxide, silicon nitride, low-k dielectrics such as carbon doped oxides, extremely low-k dielectrics such as porous carbon doped silicon dioxide, combinations of these, or the like. The passivation layer 107 may be formed through a process such as chemical vapor deposition (CVD), although any suitable process may be utilized, and may have a thickness between about 0.5 µm and about 5 µm, such as about 9.25 KÅ.

The conductive pillars 109 may be formed to provide conductive regions for contact between the metallization layers 105 and an external device 301 (not shown in FIG. 1 but illustrated and discussed below with respect to FIG. 3A) such as printed circuit boards or other semiconductor dies in, e.g., a flip-chip arrangement. The conductive pillars 109 may be formed by initially forming a photoresist (not shown) over the passivation layer 107 to a thickness greater than about 20 µm, or even greater than about 60 µm. The photoresist may be patterned to expose portions of the passivation layer 107 through which the conductive pillars 109 will extend. Once patterned, the photoresist may then be used as a mask to remove the desired portions of the passivation layer 107, thereby exposing those portions of the underlying metallization layers 105 to which the conductive pillars 109 will make contact.

After the passivation layer 107 has been patterned, the conductive pillars 109 may be formed within the openings of both the passivation layer 107 as well as the photoresist. The conductive pillars 109 may be formed from a conductive material such as copper, although other conductive materials such as nickel, gold, or metal alloy, combinations of these, or the like may also be used. Additionally, the conductive pillars 109 may be formed using a process such as electroplating, by which an electric current is run through the conductive portions of the metallization layers 105 to which the conductive pillars 109 are desired to be formed, and the metallization layers 105 is immersed in a solution. The solution and the electric current deposit, e.g., copper, within the openings in order to fill and/or overfill the openings of the photoresist and the passivation layer 107, thereby forming the conductive pillars 109. Excess conductive material outside of the openings may then be removed using, for example, a chemical mechanical polish (CMP).

After the conductive pillars 109 have been formed, the photoresist may be removed through a process such as ashing, whereby the temperature of the photoresist is increased until the photoresist decomposes and may be removed. After the removal of the photoresist, the conductive pillars 109 extend away from the passivation layer 107 a first distance d1 of between about 5 µm to about 50 µm, such as 40 µm. Optionally, a barrier layer 113 may be formed over the conductive pillars 109 by, for example, electroless plating, wherein the barrier layer 113 may be formed of nickel, vanadium (V), chromium (Cr), and combinations thereof.

However, as one of ordinary skill in the art will recognize, the above described process to form the conductive pillars 109 is merely one such description, and is not meant to limit the embodiments to this exact process. Rather, the described process is intended to be merely illustrative, as any suitable process for forming the conductive pillars 109 may alternatively be utilized. For example, forming the passivation layer 107 to a thickness greater than its eventual thickness, forming the conductive pillars 109 into an opening of the passivation layer 107, and then removing a top portion of the passivation layer 107 such that the conductive pillars 109 extend away from the passivation layer 107 may also be utilized. All suitable processes are fully intended to be included within the scope of the present embodiments.

Figure 1B:
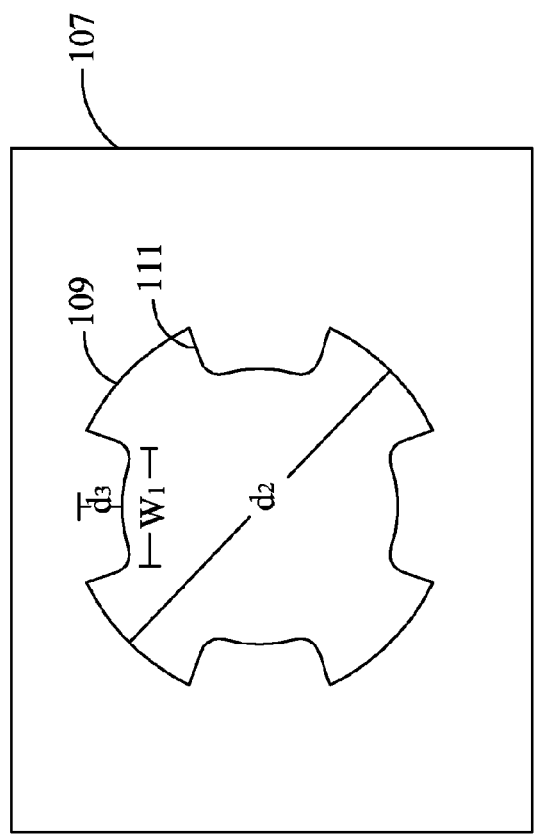

FIG. 1B illustrates a top-down view of one of the conductive pillars 109 along line 1-1' in FIG. 1A. As illustrated, the conductive pillar 109 may be shaped in order to act as a buffer for the amount of conductive material 201 (not illustrated in FIG. 1B but shown and discussed with respect to FIG. 2A below) that will be placed onto the conductive pillar 109. In particular, the conductive pillar 109 may be shaped in order to act as a reservoir of conductive material 201, such that the conductive pillar 109 can retain any excess conductive material 201 (if there is too much conductive material 201) or else supply conductive material 201 (if there is a shortage of conductive material 201) during a bonding process.

In an embodiment, the conductive pillars 109 may be formed with a series of trenches 111 or grooves alongside the outer circumference of the conductive pillars 109. These trenches 111 may be formed as a single trench or as a plurality of trenches. If there is a plurality of trenches 111, the trenches 111 may be formed symmetrically around the outer circumference of the conductive pillars 109 or, alternately, they may be formed asymmetrically around the outer circumference of the conductive pillars 109 as desired. In the embodiment illustrated in FIG. 1B, there are four trenches 111 formed symmetrically around the outer circumference of the conductive pillars 109.

The trenches 111 may be formed in such as fashion so that the capillary forces between the conductive pillar 109 and the conductive material 201 passively guides the conductive material 201 into the trenches 111. For example, in an embodiment utilizing copper as the conductive pillar 109 and utilizing solder as the conductive material, the conductive pillar 109 may be formed to have a first diameter $d_2$ of between about 10 µm and about 100 µm, such as about 80 µm, while the trenches 111 may be formed in a curved rectangular shaped as illustrated in FIG. 1B, with a first depth $d_3$ of between about 1 µm and about 10 µm, such as about 5 µm, and a first width $w_1$ of between about 3 µm and about 30 µm, such as about 20 µm.

However, as one of ordinary skill in the art will recognize, the precise shape of the trenches 111 is not limited to the curved rectangular shape described above and illustrated in FIG. 1B. Any other suitable shape that provides sufficient capillary forces in order to passively guide the conductive material 201 into the trenches 111 may alternatively be utilized. For example, a half-circle shape, a triangular shape, a re-entrant cavity shape, or the like, may alternatively be utilized.

The shaping of the conductive pillars 109 may be performed with additional process steps, but may also be performed without the requirement for any extra processing steps. For example, the trenches 111 may be formed into the conductive pillars 109 by forming the desired shape into the same photoresist that is utilized to mask and etch the passivation layer 107 during the formation of the conductive pillars 109 as described above with respect to FIG. 1A. However, any other suitable process, such as initially forming the conductive pillars 109 with a cylindrical shape and then separately forming the trenches 111, may also be utilized to form the trenches 111 into the conductive pillars 109.

FIG. 2A illustrates a cross-sectional view of the semiconductor die 100 after a conductive material 201 has been placed onto the conductive pillars 109 and a reflow process has been performed on the conductive material 201. The conductive material 201 may comprise a material such as tin, or other suitable materials, such as silver, lead-free tin, or copper. In an embodiment in which the conductive material 201 is tin, the conductive material 201 may be formed by initially forming a layer of tin through such commonly used methods such as evaporation, electroplating, printing, etc., to a thickness of between about 10 µm and about 30 µm, such as about 15 µm.

Once the conductive material 201 has been formed on the conductive pillars 109, a reflow process may be performed to transform the conductive material 201 into conductive bumps 205. In the reflow process the temperature of the conductive material 201 is raised to between about 200° C. and about 260° C., such as about 250° C., for between about 10 seconds and about 60 seconds, such as about 35 seconds. This reflow process partially liquefies the conductive material 201, which then pulls itself into the desired bump shape due to the conductive material's 201 surface tension.

Additionally, this same surface tension of the conductive material 201, in conjunction with the capillary forces between the conductive material 201 and the conductive pillar 109, will also guide the conductive material 201 into the trenches 111 over the passivation layer 107 along the outer circumference of the conductive pillar 109. The conductive material 201 may be pulled into the trenches 111 enough to fill the trenches 111 all the way down to the passivation layer 107 (as illustrated in a first region labeled 207), or else may be pulled only part of the way into the trenches 111 (as illustrated in a second region labeled 209).

Once within the trenches 111, the surface tension of the conductive material 201 keeps the conductive material 201 controlled by the trenches 111. This passive control is exerted even to some conductive material 201 that is located outside of the trenches 111, as the surface tension of the conductive material 201 will shape the conductive material 201 into a bulge that extends outward from the trenches 111 (as illustrated in FIG. 2B below) a second distance $d_4$ between about 1 µm and about 15 µm, such as about 10 µm. By this process, the trenches 111 can act as a reservoir for conductive material 201 by essentially storing excess conductive material 201 in the trenches 111 along the sides of the conductive pillars 109, even if the excess conductive material 201 stored is larger than the actual volume of the trenches 111 themselves.

FIG. 2B illustrates an expanded top-down view of one of the conductive pillars 109 along line 2-2' in FIG. 2A after the reflow process. During the reflow process excessive conductive material 201 is passively guided into and fills the trenches 111 along the outer circumference of the conductive pillar 109. As discussed above, the trenches 111 may control even more conductive material 201 than may fit within the trenches 111, as the surface tension of the conductive material 201 allows the conductive material 201 to extend beyond the first diameter $d_2$ of the conductive pillar 109 bulge out of the confines of the trenches 111 while still being passively controlled by the trenches 111.

By passively guiding the conductive material 201 into the trenches during the initial reflow process, excess conductive material 201 may be stored, thereby reducing the possibility of excess conductive material 201 bridging with an adjacent conductive pillar 109. Additionally, by guiding excess conductive material 201 along the sidewalls of the conductive pillar 109, the excess conductive material 201 may also reduce the area of the sidewalls that is exposed and which may be oxidized, thereby reducing the chance of delamination.

Figure 3A:
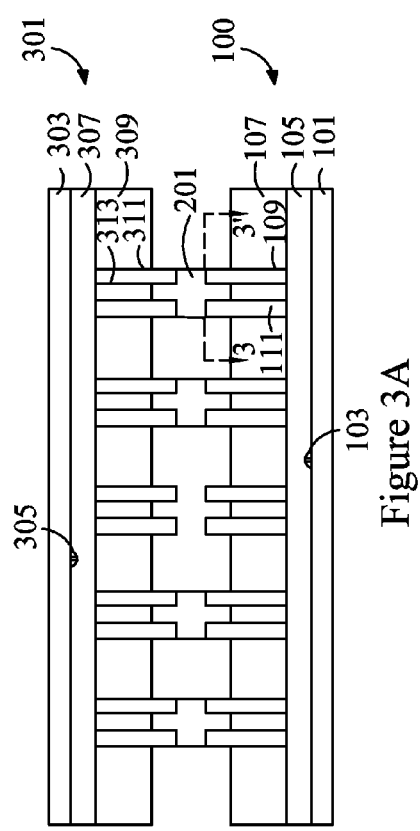
FIGS. 3A-3B illustrate the bonding of the substrate with another substrate through the conductive material in accordance with an embodiment.

FIG. 3A illustrates a cross-sectional view of the semiconductor die 100 after the semiconductor die 100 has been bonded to an external device 301. As illustrated, the external device 301 may be similar to the semiconductor die 100, with an external substrate 303, external active devices 305, external metallization layers 307, an external passivation layer 309, and external conductive pillars 311 with external trenches 313. However, the external device 301 is not limited to another semiconductor die, and may include other devices, such as a printed circuit board, a packaging substrate, or any other suitable device that provides a desired connection to the conductive pillars 109 through the conductive material 201.

In an embodiment in which the external device 301 is similar to the semiconductor die 100, the conductive bumps 205 (not shown in FIG. 3A but illustrated and described above with respect to FIG. 2A) are aligned and placed in physical and electrical contact to the external conductive pillars 311 on the external substrate 303. Once the conductive material 201 is in physical contact with the external conductive pillars 311, a bonding process may be performed. The bonding process may include raising the temperature of the conductive material 201 so as to again reflow the conductive material 201 while simultaneously applying a pressure. The reflow allows the conductive material 201 to bond to the external conductive pillars 311, thereby bonding the semiconductor die 100 to the external device 301.

During the bonding process, the trenches 111 in the conductive pillars 109 act as a reservoir through which conductive material may be supplied to the conductive bumps 205 or else removed from the conductive bumps 205. For example, if there is excess conductive material 201 formed in the conductive bump 205, this excess conductive material may passively be guided into the trenches 111 during the reflow and bonding process, thereby reducing the possibility of an undesired bridge between adjacent conductive pillars 109. Additionally, if there is not enough conductive material 201 in the conductive bump 205 to form a bond to the external conductive pillars 311 (which would normally lead to a cold joint), extra conductive material 201 that was stored in the trenches 111 may be passively pulled from the trenches 111 to supply additional conductive material 201 to the conductive bump 205, thereby helping to prevent a cold joint from occurring.

Additionally, because the trenches 111 break up the normally cylindrical shape of the conductive pillars 109, the forces applied to the conductive pillars 109 by the surface tension of the conductive material 201 are applied unevenly to different parts of the conductive material 201. For example, the surface tension of the conductive material 201 may apply a force to the conductive pillars 109 around the trenches 111 different from a force applied to the conductive pillars 109 that is not located around the trenches 111. This difference in forces may provide a self-alignment during the bonding and reflow process by imparting a rotational force to the conductive pillars 109 and the external conductive pillars 311 until the trenches 111 within the conductive pillars 109 and the external trenches 313 within the external conductive pillars 311 are aligned with each other. This rotational force helps to correct or reduce any potential errors in alignment or alignment mismatch by helping to align the conductive pillars 109 and the external conductive pillars 311.

Figure 3B:
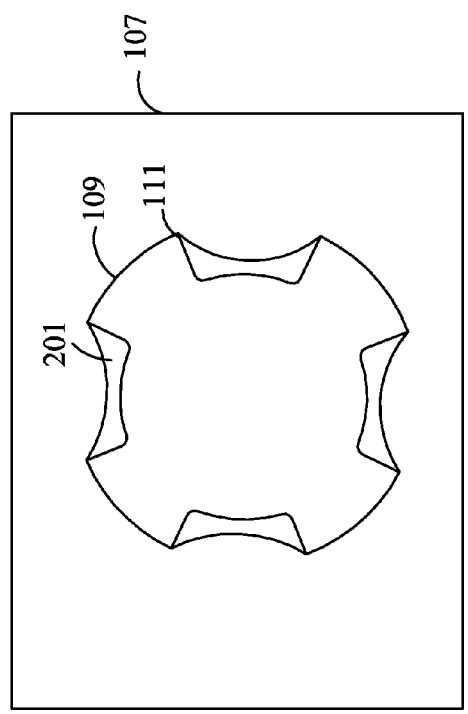

FIG. 3B illustrates an expanded top-down view of one of the conductive pillars 109 after the reflow and bonding process along line 3-3' in FIG. 3A in which the trenches 111 supplied extra conductive material 201 to the conductive bump 205. As illustrated, additional conductive material 201 has been removed from the trenches 111 and added to the conductive bump 205 (not shown in FIG. 3B but illustrated in FIG. 3A above). Such a removal may, but does not have to, result in a reduction of the bulge of conductive material 201 (as seen in FIG. 2B above) such that the conductive material 201 is completely contained within the trenches 111.

Figure 4:
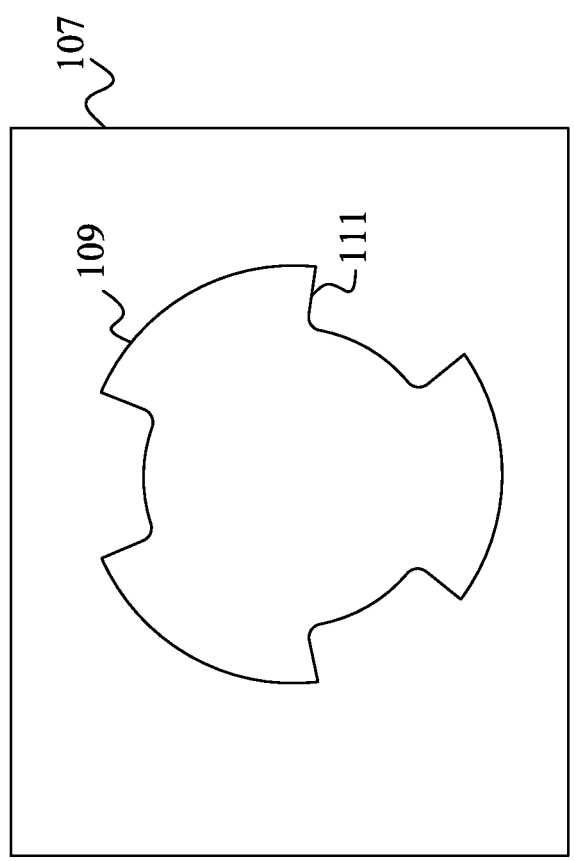
FIG. 4 illustrates a conductive pillar with asymmetrically placed trenches in accordance with an embodiment.

FIG. 4 illustrates another embodiment in which the trenches 111 around the periphery of the conductive pillar 109 may be placed in an asymmetric pattern. For example, the trenches 111 around the conductive pillar 109 may be placed a third of the way around the circumference of the conductive pillar 109 such that they are not mirror images of each other on opposite sides of the conductive pillar 109. By placing the trenches 111 asymmetrically around the conductive pillar 109, the rotational forces between the conductive pillars 109 and the external conductive pillars 311 (see, e.g., FIG. 3A above) may be enhanced, and the self-alignment between the conductive pillars 109 and the external conductive pillars 311 may be increased, further helping to correct or reduce any potential errors in alignment or alignment mismatch between the conductive pillars 109 and the external conductive pillars 311 when they are bonded together.

In accordance with an embodiment, a semiconductor device comprising a first substrate and a conductive post extending away from the first substrate is provided. The conductive post comprises one or more trenches perpendicular to the first substrate.

In accordance with another embodiment, a semiconductor device comprising a passivation layer located over a substrate is provided. A conductive post extends through the passivation layer, the conductive post having an outer circumference, and a plurality of grooves is located around the outer circumference of the conductive post. A conductive material is located over the conductive post.

In accordance with yet another embodiment, a method of manufacturing a semiconductor device comprising forming a first conductive pillar with one or more trenches over a substrate, the one or more trenches being perpendicular to the substrate, is provided. Conductive material is placed onto the first conductive pillar, and the conductive material is reflowed such that a portion of the conductive material is passively guided into the one or more trenches.

Although the embodiments and their advantages have been described in detail, it should be understood that various changes, substitutions and alterations can be made herein without departing from the spirit and scope of the embodiments as defined by the appended claims. For example, the materials used for both the conductive pillars and the conductive material may be modified while still remaining within the scope of the embodiments. Additionally, the exact shape of the trenches formed within the conductive pillars may also be modified while still remaining within the scope of the embodiments.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A method of manufacturing a semiconductor device, the method comprising:
   forming a first conductive pillar with one or more trenches over a substrate, the one or more trenches having a longitudinal axis that is perpendicular to the substrate;
   disposing conductive material into the one or more trenches of the first conductive pillar;
   after disposing conductive material into the one or more trenches, placing a second conductive pillar in contact with the conductive material; and
   after placing the second conductive pillar, reflowing the conductive material to bond the second conductive pillar to the first conductive pillar using the conductive material, wherein the reflowing causes a portion of the conductive material within the one or more trenches to flow toward the second conductive pillar, wherein the conductive material self-aligns the first conductive pillar to the second conductive pillar.

2. The method of claim 1, wherein the reflowing the conductive material further forms an extension of the conductive material beyond a diameter of the first conductive pillar.

3. The method of claim 1, wherein the forming the first conductive pillar with the one or more trenches further comprises forming two or more trenches symmetrically around the conductive pillar.

4. The method of claim 1, wherein the first conductive pillar comprises copper.

5. The method of claim 1, further comprising forming a barrier layer over the first conductive pillar before disposing the conductive material into the first conductive pillar.

6. The method of claim 1, wherein the first conductive pillar extends through a passivation layer over the substrate.

7. A method of manufacturing a semiconductor device, the method comprising:
   forming a first conductive post with one or more trenches over a substrate, the one or more trenches extending at least from a passivation layer disposed over the substrate to an end of the first conductive post opposite the substrate;
   placing conductive material onto the first conductive post;
   reflowing the conductive material such that a first portion of the conductive material is retained within the one or more trenches;
   after reflowing the conductive material, placing a second conductive post in contact with the conductive material; and
   after placing the second conductive post, reflowing the conductive material to form a bond between the first conductive post and the second conductive post, wherein the reflowing removes at least some of the first portion of the conductive material from the one or more trenches to the bond.

8. The method of claim 7, wherein the conductive material is solder.

9. The method of claim 7, wherein the one or more trenches comprises four trenches.

10. The method of claim 7, wherein the conductive material fills the one or more trenches over the substrate.

11. The method of claim 7, wherein the conductive material only partially fills the one or more trenches over the substrate.

12. The method of claim 7, wherein the conductive material extends past an outermost circumference of the first conductive post prior to placing the second conductive post.

13. A method of manufacturing a semiconductor device, the method comprising:
- forming a first conductive pillar extending through a passivation layer and having a first longitudinal groove and an outer circumference;
- placing conductive material onto the first conductive pillar;
- performing a first reflowing of the conductive material such that capillary forces between the first conductive pillar and the conductive material passively guide at least a portion of the conductive material into the first longitudinal groove, wherein the conductive material extends to the passivation layer and the conductive material extends past the outer circumference of the first conductive pillar;
- after performing the first reflowing, placing a second conductive pillar in contact with the conductive material; and
- after placing the second conductive pillar, performing a second reflowing of the conductive material to bond the second conductive pillar to the first conductive pillar, wherein the second reflowing removes some of the conductive material from the first longitudinal groove.

14. The method of claim 13, wherein the conductive material self-aligns the first conductive pillar and the second conductive pillar during the second reflowing.

15. The method of claim 13, wherein the conductive material is solder.

16. The method of claim 13, wherein the first conductive pillar extends through a passivation layer, wherein the conductive material extends to the passivation layer after the first reflowing.

17. The method of claim 13, wherein the first conductive pillar only has four longitudinal grooves.

18. The method of claim 17, the first conductive pillar further comprising:
- a second longitudinal groove;
- a third longitudinal groove; and
- a fourth longitudinal groove, wherein the first longitudinal groove, the second longitudinal groove, the third longitudinal groove, and the fourth longitudinal groove are disposed symmetrically around the outer circumference of the first conductive pillar.

19. The method of claim 13, wherein the first conductive pillar is copper.

* * * * *